United States Patent [19]

Fraass et al.

[11] 4,213,045
[45] Jul. 15, 1980

[54] METAL NITRIDE OXIDE SEMICONDUCTOR (MNOS) DOSIMETER

[75] Inventors: Ronald G. Fraass, USAF Academy, Colo.; Roger W. Tallon, Albuquerque, N. Mex.

[73] Assignee: The United States of America as represented by the Secretary of the Air Force, Washington, D.C.

[21] Appl. No.: 937,909

[22] Filed: Aug. 29, 1978

[51] Int. Cl.$^2$ .............................................. G01T 1/24
[52] U.S. Cl. ................................................... 250/370
[58] Field of Search .................. 250/370, 371; 357/54, 357/23, 29

[56] References Cited

U.S. PATENT DOCUMENTS 3,821,566  6/1974  Cricchi .................................. 357/54

OTHER PUBLICATIONS

R. Williams et al., "Radiation-Induced Memory Loss in Thin-Oxide MNOS Devices," IEEE Trans. Nuc. Sci., vol. 23, No. 6, 12-76, pp. 1554-1557.
D. Ciarlo, "MOSFET Detector Evaluation," IEEE Trans. Nuc. Sci., vol. 21, No. 1, 2-74, pp. 390-394.
R. Fraass et al., "Use of a Metal-Nitride-Oxide-Semiconductor as the Detector for a Radiation Dosimeter," IEEE Trans. Nuc. Sci., vol. 25, No. 6, 12-78, pp. 1613-1617.
Perkins et al., "Radiation Effects and Electrical Stability of Metal-Nitride-Oxide-Silicon Structures," App. Phys. Letters, vol. 12, No. 11, 6-1-68, pp. 385-387.

Primary Examiner—Alfred E. Smith
Assistant Examiner—Carolyn E. Fields
Attorney, Agent, or Firm—Joseph E. Rusz; Casimer K. Salys

[57] ABSTRACT

A high radiation level dosimeter capable of measuring total ionizing radiation doses from gamma ray, X-ray, or E-beam sources by detecting charge variations in the gate structure of a metal nitride oxide semiconductor (MNOS) type transistor. The MNOS device displays a unique combination of characteristics allowing the storage, removal and measurement of the electrical charge trapped within its gate structure. The magnitude of the charge remaining is ascertained by measuring the threshold voltage necessary to produce a prescribed output current response, while the rate at which this charge decays is dependent on both the elapsed time and total ionizing radiation dose. Since the time and radiation dose effects on the charge are independent and cumulative, the device is capable of being subjected to high radiation doses without permanent effects, and the electrical performance of the device is repeatable to a high degree of accuracy, isolation and measurement of the total radiation dose is readily discernible from the MNOS response. After calibration the device is restored to its unradiated state and subjected to the ionizing radiation source of unknown level, while both the MNOS device response and the elapsed time are recorded. The total ionizing radiation dose administered by the source being measured is obtained by referring to the calibration results containing responses independently attributable to time and total ionizing radiation dose.

5 Claims, 4 Drawing Figures

METAL NITRIDE OXIDE SEMICONDUCTOR (MNOS) DOSIMETER

RIGHTS OF THE GOVERNMENT

The invention described herein may be manufactured and used by or for the Government of the United States for all governmental purposes without the payment of any royalty.

BACKGROUND OF THE INVENTION (1) Field of the Invention

This invention is in the field of radiation dosimeters of the type which are capable of accurately measuring ionizing radiation doses of large magnitudes.

(2) Description of the Prior Art

A variety of ionizing radiation dosimeters are known by those skilled in the art. Conventionally, these are of the type which must be removed from the area of radiation to obtain a measurement of the dose, exemplified by thermoluminescence or ceric sulphate dosimeters. When the radiation doses are being administered in vacuum chambers or other inaccessible locations, and repeated radiation dose measurements are needed from the test point, the disruption associated with the use of a dosimeter requiring removal for measurement becomes a significant hindrance.

Semiconductor type devices have been used as direct reading radiation dose measuring sensors, but generally exhibit either marginal accuracy or permanent radiation effects. Metal oxide semiconductor field effect transistors (MOSFETs) and metal oxide semiconductor capacitors (MOSCs) are representative. The accuracy of these semiconductors is usually limited to ±5% when the devices are selected from the same semiconductor wafer and ±20% when this selective process is not exercised. Furthermore, devices such as MOSFETs exhibit radiation effects, in the form of permanent saturation, at doses in the range of 40 K rads (Si). Such devices become completely inadequate when the dose levels to which they are to be subjected are two orders of magnitude larger.

SUMMARY OF THE INVENTION

The present invention addresses itself to a radiation dosimeter which relies upon the unique characteristics of an MNOS device for absorbing ionizing radiation and measuring the level of the dose administered. This dosimeter is capable of accurately and repeatably measuring high levels of ionizing radiation produced by sources of X-rays, gamma rays, or high energy E-beams by monitoring the electrical performance characteristics of the MNOS device. When used in the manner taught, the device responds to total dose, unaffected by the rate at which the dose is administered.

An MNOS transistor of a non-stepped gate configuration is subjected to a saturating electrical voltage between its gate and substrate connections of sufficient magnitude and duration to produce a stored charge in the gate structure. When the device has undergone charging and is not being irradiated the trapped charge remains for a relatively long period of time, decaying at a consistent and measurable rate. Upon being subjected to ionizing radiation the rate at which the charge dissipates increases significantly. The difference between the magnitude of residual charge with and without ionizing radiation is functionally related to the total radiation dose administered to the MNOS device.

The MNOS dosimeter measures the charge loss by electrically monitoring the threshold voltage, which is defined as the voltage from the gate to the substrate that is needed to produce a prescribed small source to drain current. To prevent the measurement process from modifying the magnitude of the remaining charge, the probing voltages applied to the MNOS gate to determine the threshold voltage consist of short duration pulses.

Since the threshold voltage is a measure of the charge remaining in the gate structure, and the difference between the voltage measured and that attributable to time related decay is a measure of radiation dose, threshold voltage measurements from a calibrated MNOS device can provide, by a subtraction process, a direct measure of the ionizing radiation dose.

DESCRIPTION OF THE PREFERRED EMBODIMENT

Figure 1:
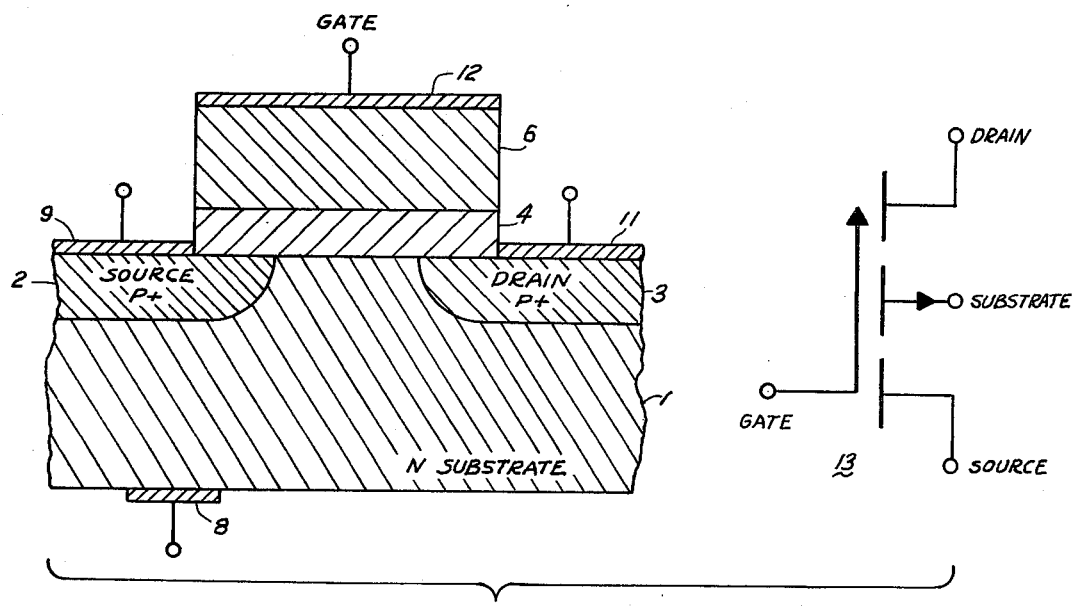
FIG. 1 is a schematic cross-sectional view showing the structural characteristics of a p-channel enhancement mode MNOS transistor, and also showing the symbol for the device.

The MNOS device shown in a cross-sectional view in FIG. 1 embodies a configuration generally known as a p-channel enhancement mode MNOS transistor. Substrate 1 is 200 microns thick and fabricated from lightly doped n-type silicon. Source 2 and drain 3 are both heavily doped p-type regions. The gate structure is immediately above and between source 2 and drain 3, being comprised of a lower layer 4, consisting of 20 angstroms of $SiO_2$, and an upper layer 6, consisting of 500 angstroms of $Si_3N_4$. Metalized contacts 8, 9, 11 and 12 are provided for electrical connections to the substrate, source, drain and gate regions, respectively. The electrical symbol for this particular device appears at 13.

For purposes of the invention threshold voltage was defined as that voltage from the gate to the substrate which produces a source to drain current flow equal to the leakage current plus ten microamperes. As was noted previously, the threshold voltage varies in response to the magnitude of stored charge remaining in the gate structure. Thereby, the threshold voltage is an electrically measurable indicator of the elapsed time and the radiation dose effects on the stored charge in the MNOS transistor.

The process of placing a charge in the gate structure is defined as "writing". It consists of applying a positive voltage pulse between the gate and substrate of sufficient magnitude and duration to saturate the device. During "writing" electrons penetrate the thin silicon oxide, layer 4, by a tunneling process and enter deep traps in the silicon nitride, layer 6, near the boundary of the silicon nitride and silicon oxide layers. Saturation occurs when the field across silicon oxide layer 4, due to the trapped charges, has stabilized and is equal to the field produced by the voltage applied between gate connection 12 and substrate connection 8. When the "write" voltage is removed, the negative polarity stored charge draws holes from substrate 1 to the interface between substrate 1 and silicon oxide layer 4. These holes partially open a conductive path between source 2 and drain 3, in conventional fashion, producing a rise in the source to drain current flow.

As is known by those skilled in the art, the stored charge in a MNOS device of this type will dissipate with time. In doing so the variation in the magnitude of the remaining charge will modify the magnitude of the measured threshold voltage accordingly. The relationship between threshold voltage and time has been shown to be logarithmic. This appears in plot 14 of FIG. 2, hereinafter referred to as the nonradiation decay curve.

Ionizing radiation also produces changes in the magnitude of the charge remaining in the MNOS transistor. Such radiation generates electron-hole pairs within the MNOS transistor. These charges move through silicon oxide layer 4 under the influence of the internal electric field produced by the electrons trapped in silicon nitride layer 6. As these free charges combine with the trapped ones the magnitude of the stored charge is reduced and the threshold voltage is modified. Referring again to FIG. 2, plot 16 shows the threshold voltage in a MNOS device when the transistor is subjected to the combined effects of time related charge decay and ionizing radiation at a dose rate of 20 K rad (Si) per minute administered by a Co-60 source.

The foregoing has shown and described that the stored charge in an MNOS device is responsive to the effects of both time and ionizing radiation dose, and that both are measurable with reference to electrical parameters of the MNOS transistor. Two factors remain: the device's dependence on the rate at which the dose is administered, and its ability to be reset to a non-irradiated condition after a calibration dose.

Testing and analysis have shown that an MNOS device of the form described above has a response which is independent of the dose rate. Therefore, the electrical performance of the device, measured in terms of threshold voltage, is functionally related to the total ionizing radiation dose. The effect of such a conclusion is that plot 14 may be subtracted from plot 16, with the difference in threshold voltage being directly attributable to the radiation dose administered.

Accurate calibration of an MNOS transistor in a dosimeter application depends on the ability of the device to be reset to its non-irradiated state, i.e. without retaining permanent effects from the radiation dose administered during the calibration process. As was noted previously, other semiconductor devices such as MOSCs and MOSFETs are being used as dosimeter sensors, but because of semipermanent effects cannot be subjected to a calibration dose prior to actual use. These devices are thereby restricted in accuracy by the device-to-device manufacturing tolerances.

The MNOS transistor of the type described has shown the ability to reset completely after repeated radiation doses. Furthermore, the threshold voltage response of the device is very consistent from sequence to sequence, making accurate calibration feasible. Testing has also shown that this capability is retained even when ionizing radiation dose levels exceed 10 M rad (Si).

Another aspect of this invention is a teaching of the means by which threshold voltages, or similar performance parameters, may be obtained so as to reflect the magnitude of stored charge in the MNOS transistor gate structure. For purposes of this embodiment, threshold voltage is measured by a process called "reading". During the process of "reading" negative voltage pulses of increasing magnitudes are applied between gate contact 12 and substrate contact 8. The source to drain current is monitored until the current response equals or exceeds ten microamperes plus leakage, the amount used to define threshold voltage.

Since "reading" has the opposite effect on the stored charge as "writing", it is necessary to prevent the "reading" process from disturbing the magnitude of the stored charge. Testing and analysis have shown that the stored charge will not be molested if the "read" pulse width is sufficiently narrow. The objective, then, is to use the shortest duration "read" pulse which will produce a current output whose dynamics have reached a measurable steady state. Since multiple read pulses will normally be applied before an appropriate output response appears, the importance of narrow read pulses cannot be overlooked.

Having described the MNOS device and the various characteristics which bear upon its use as a dosimeter, the forthcoming discloses an electronic circuit capable of performing the "write" and "read" functions described above. As will be readily apparent to those skilled in the art the functions described hereinafter, with reference to the manually operated combination of electronic circuits, may be automated, yet, remain within the purview of the invention as shown and described.

Figure 3:
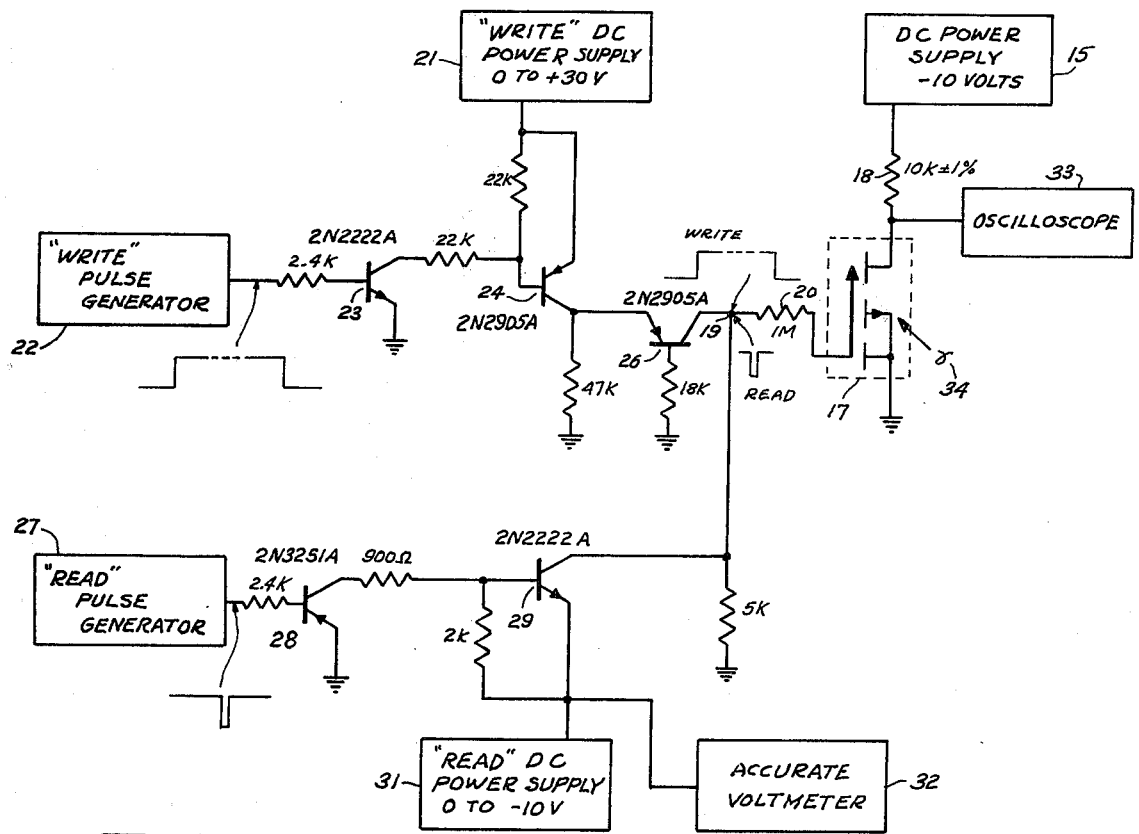
FIG. 3 contains a schematic of the MNOS dosimeter disclosed herein.

Referring now to FIG. 3, which shows schematically a dosimeter in accordance with the invention, MNOS transistor 17 is generally fabricated in accordance with conventional techniques, modified as necessary to conform to the specific structural constraints previously described herein. The substrate and source leads from transistor 17 are grounded while the drain lead is attached through 10 Kohm precision resistor 18 to negative 10 volt DC power supply 15. Connected between the gate input of transistor 17 and node 19 is one megohm resistor 20. Resistor 20 protects the MNOS device gate by limiting the current into it. Node 19 is the common electrical connection through which "write" and "read" signals are transmitted into MNOS transistor 17.

The electronic circuits generating the "write" and "read" signals at node 19 will now be described summarily.

Consider the "write" circuit first. The voltage amplitude of the "write" pulse, positive at node 19, is controlled by power supply 21 and is capable of being varied from zero to +30 volts. The timing of the "write" pulse is controlled by pulse generator 22 and is adjusted to be of a duration sufficient to saturate the MNOS transistor into a high conductance state. When generator 22 produces a "write" pulse transistor 23 conducts, energizing transistors 24 and 26 in conventional sequence. With transistors 24 and 26 conducting the positive polarity "write" voltage from power supply 21 effectively appears at node 19.

The electronics in the "read" circuit operate similarly, though the polarity of the voltage, as it appears at node 19, is now negative. As noted previously, the "read" process involves the application of multiple, short duration pulses of varying amplitude until the output response indicates that the level is at threshold voltage. The duration of each pulse is greater than two orders of magnitude less than the time period necessary to clear the MNOS transistor of stored charge. For each "read" pulse emanating from generator 27 transistors 28 and 29 conduct. When transistor 29 is conducting, negative power supply 31 is effectively made common with node 19. Accurate voltmeter 32 provides a measure of the peak "read" pulse voltage being applied to node 19 and the gate input of MNOS transistor 17.

The output response of transistor 17 to each individual "read" pulse is detected by oscilloscope 33 operating in the A.C. mode to eliminate the effect of the leakage current. When the current response, measured across precision resistor 18, indicates that the "read" pulse is at the threshold level, voltmeter 32 provides a measure of that voltage.

Figure 2:
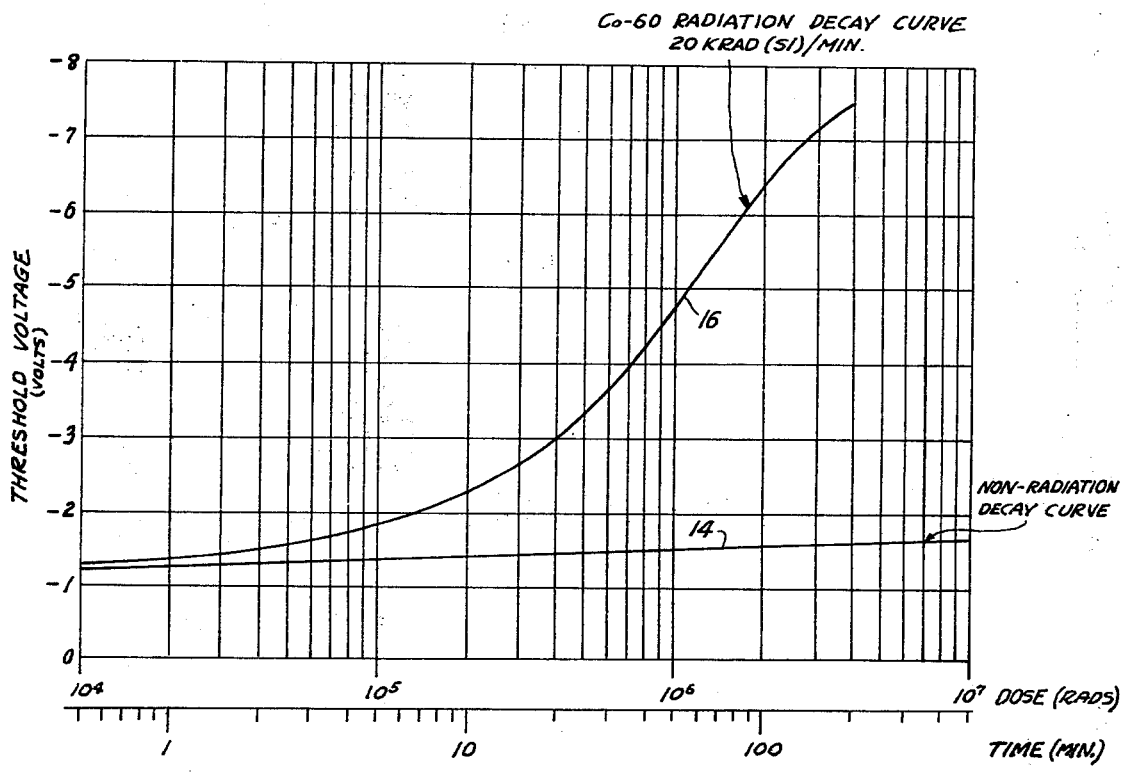
FIG. 2 is a graph showing two threshold voltage plots as functions of time, shown with and without the effects of ionizing radiation.

The MNOS dosimeter described is capable of detecting ionizing radiation doses from gamma ray, X-ray or high energy E-beam sources. Irradiation testing of the embodying MNOS device was performed using two different gamma radiation sources. FIG. 2 shows the threshold voltage response of a MNOS transistor with and without ionizing radiation. The saturated threshold voltage for this device ranged from approximately $-0.5$ to $-10$ volts, with charge decay times measured in hours. The "write" pulse consisted of $+24$ volts for a period of one second, while the "read" pulses ranged from 100 to 600$\mu$ seconds in duration, with the latter being more appropriate when the threshold voltage approached the $-10$ volt end of its limits. The negative polarity "read" pulses were applied in sequential fashion until a 100 millivolt pulse was observed on AC coupled oscilloscope 33. The 100 millivolt pulse across precision resistor 18 corresponds to 10$\mu$ amperes of current flow, which by definition is the threshold level of gate voltage.

The procedure used to calibrate the MNOS dosimeter for subsequent dose measurements is preferably described with reference to the plots shown in FIGs. 2 and 4. Nonradiation decay curve 14 is a plot of threshold voltage as a function of time alone. Taking similar threshold voltage measurements while subjecting the MNOS transistor to an accurate, known ionizing radiation dose rate, such as 20 K rad (Si) per minute from a Co-60 gamma source, produces a radiation decay curve such as plot 16. Independence of the time and ionizing radiation effects allows the threshold voltage difference between plots 16 and 14, at any one point in time, to be a measure of the radiation dose effects on the voltage. Furthermore, since tests have shown threshold voltage to be dose rate independent, the time axis can be converted to a scale calibrated in radiation dose by simple multiplication of the 20 K rad (Si) per minute constant dose rate with the elapsed time. The result of applying this procedure to FIG. 2 is plotted in FIG. 4, showing the relationship between the difference in threshold voltage and the ionizing radiation dose.

Once calibrated the MNOS device is prepared for measuring ionizing radiation by the mere reapplication of a "write" pulse. The radiation dose is measured by recording the threshold voltage and elapsed time. The amount of threshold voltage attributable to time is then obtained by referring to the calibration graph, plot 14 in FIG. 2. This magnitude of voltage is subtracted from the measured threshold voltage. The voltage remaining is directly related to the magnitude of the ionizing radiation dose and may be converted to dose by using the calibration plot in FIG. 4.

Figure 4:
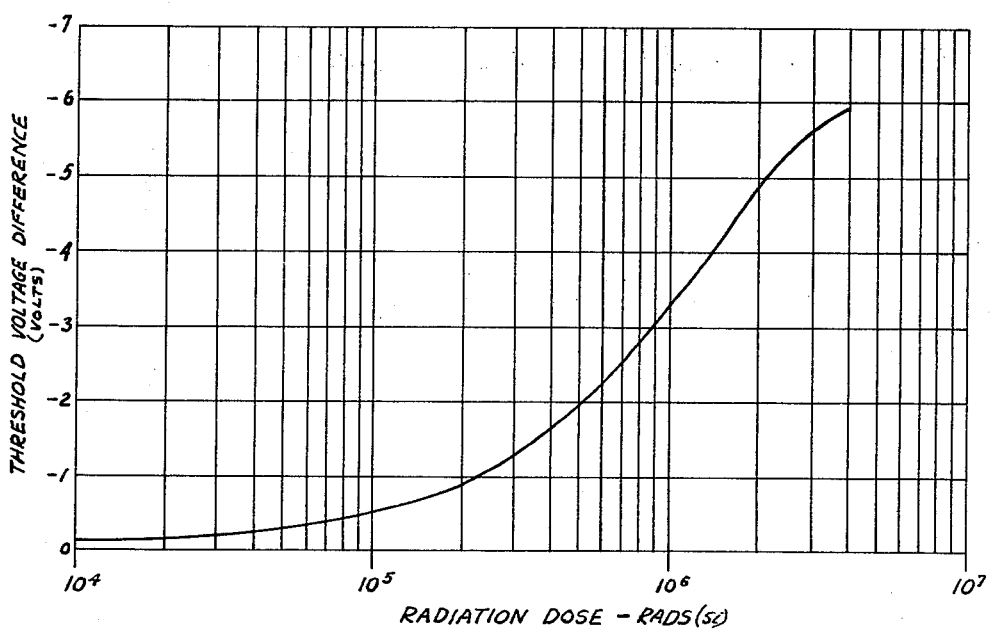
FIG. 4 is a graph of the difference between the plots in FIG. 2, with the abscissa axis in units of ionizing radiation dose.

The MNOS dosimeter which is represented by the calibration plots in FIGS. 2 and 4 has shown to operate effectively over a dose range of 50 K to 3 M rad (Si). In this dose range the measurements have been reproducible within $\pm 2\%$.

Some points of caution are noteworthy. First, the stepped gate form of MNOS structure is susceptible to permanent radiation effects and is therefore not recommended for use as a dosimeter sensor. Secondly, the presence of other circuits on the silicon chip containing the particular MNOS devices tested appears to have affected their performance, though the result was not linked to any direct effect of radiation on the MNOS transistor. The performance degradation that was encountered appeared to be due to charge migration to the MNOS transistors from elsewhere on the large integrated circuit chip within which the MNOS devices were formed. In view of this, discrete MNOS devices would appear to be preferred for dosimeter applications.

We claim:

1. A dosimeter for measuring ionizing radiation doses of X-ray, gamma ray or E-beam energy, comprising:
    a. a metal nitride oxide semiconductor (MNOS) transistor capable of storing an electric charge within its gate structure, and further capable of dissipating that stored charge with separable and independent effects attributable to the time elapsed and the total ionizing radiation dose imposed;
    b. a voltage source attachable to the gate and substrate of the MNOS transistor to create a stored charge; and
    c. a device for measuring the voltage at the gate of the transistor required to produce a prescribed small current flow between the source and drain of the MNOS transistor, for measuring the undissipated stored charge.

2. A dosimeter for measuring ionizing radiation doses of X-ray, gamma ray of E-beam energy, comprising:
    a. a discrete, non-stepped gate, p-channel, enhancement mode metal nitride oxide semiconductor (MNOS) transistor capable of storing an electric charge within its gate structure, and further capable of dissipating that stored charge on the basis of the separable and independent effects of the time elapsed and the total ionizing radiation dose imposed;
    b. a voltage source attachable to the gate and substrate of the MNOS transistor for a time duration sufficient to fully saturate the level of charge stored in the gate structure; and
    c. a device for measuring the voltage at the gate of the transistor required to produce a prescribed small current between the source and drain of the MNOS transistor, which measures the undissipated stored charge with a pulse of sufficiently short duration to avoid disturbing the magnitude of the stored charge, and at least two orders of magnitude shorter than the time necessary to dissipate the stored charge.

3. A process for using a MNOS device to measure the magnitude of the ionizing radiation dose from an X-ray, gamma ray or E-beam source, comprising the steps:
    a. calibrating the non-radiation, time related decay response of a MNOS device by creating a stored charge within the device and detecting its rate of dissipation;

b. calibrating the irradiated, time related decay response of the MNOS device by repeating the calibration described in step a while subjecting the MNOS device to a constant, known dose rate of ionizing radiation;

c. tabulating the difference in response between that of step a and that of step b, as a function of time;

d. converting the tabulated difference in response from a function of time to a function of total ionizing radiation dose;

e. creating a stored charge within the MNOS device;

f. subjecting the MNOS device to the ionizing radiation environment to be measured;

g. measuring the response of the MNOS device and the time elapsed;

h. subtracting that portion of the response attributable to elapsed time, based on the calibration performed in step a, from the response measured in step g; and i. obtaining a measure of the total ionizing radiation dose by referring to the converted tabulation formed in step d.

4. The process as recited in claim 3, wherein, the responses measured in steps a, b and g are threshold voltages in the MNOS device.

5. The process as recited in claim 4, wherein, the stored charge created in steps a, b and e is the result of a voltage applied between the gate and substrate of the transistor for a duration sufficient to saturate the level of the charge stored in the device.

* * * * *